(12) United States Patent
Nagata et al.

(10) Patent No.: US 10,847,495 B2
(45) Date of Patent: Nov. 24, 2020

(54) BONDING SYSTEM AND BONDING METHOD

(71) Applicant: Tokyo Electron Limited, Tokyo (JP)

(72) Inventors: Atsushi Nagata, Koshi (JP); Hiroshi Maeda, Koshi (JP); Kenji Sugakawa, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/374,847

(22) Filed: Apr. 4, 2019

(65) Prior Publication Data

US 2019/0312007 A1 Oct. 10, 2019

(30) Foreign Application Priority Data

Apr. 5, 2018 (JP) ................. 2018-072832

(51) Int. Cl.
*H01L 23/00* (2006.01)
*H01L 21/00* (2006.01)
*H01L 21/683* (2006.01)

(52) U.S. Cl.
CPC .............. *H01L 24/83* (2013.01); *H01L 24/75* (2013.01); *H01L 21/6838* (2013.01); *H01L 2224/751* (2013.01); *H01L 2224/83894* (2013.01)

(58) Field of Classification Search
CPC ............. H01L 21/6838; H01L 21/2007; H01L 21/67092; H01L 21/187; H01L 21/67034; H01L 24/75; H01L 24/32; H01L 24/27; H01L 24/29; H01L 24/83; H01L 2224/83894; H01L 2224/751; H01L 2224/278; H01L 2224/29394; H01L 2224/29395; H01L 2224/3201

See application file for complete search history.

(56) References Cited

U.S. PATENT DOCUMENTS 8,795,463 B2 * 8/2014 Nishibayashi ........ H01L 21/187
156/272.2
10,006,961 B2 * 6/2018 Hosaka .............. G01R 31/2893
(Continued)

FOREIGN PATENT DOCUMENTS

| JP | 2015-018926 A | 1/2015 |
| JP | 2017-005058 A | 1/2017 |
| JP | 2018-026413 A | 2/2018 |

*Primary Examiner* — Nikolay K Yushin
(74) *Attorney, Agent, or Firm* — Pearne & Gordon LLP (57) ABSTRACT

A bonding system includes a surface modifying apparatus, a surface hydrophilizing apparatus and a bonding apparatus. The surface modifying apparatus is configured to modify a bonding surface of a first substrate and a bonding surface of a second substrate with plasma. The surface hydrophilizing apparatus is configured to hydrophilize the modified bonding surfaces of the first substrate and the second substrate. The bonding apparatus includes a condensation suppressing gas discharge unit, and is configured to bond the hydrophilized bonding surfaces of the first substrate and the second substrate by an intermolecular force. The condensation suppressing gas discharge unit is configured to discharge a condensation suppressing gas toward a space between a peripheral portion of the bonding surface of the first substrate and a peripheral portion of the bonding surface of the second substrate facing each other.

7 Claims, 8 Drawing Sheets

(56) References Cited

U.S. PATENT DOCUMENTS

2012/0318432 A1* 12/2012 Nishibayashi ........ H01L 21/187
156/64
2016/0091562 A1* 3/2016 Hosaka .............. G01R 31/2893
324/757.01

* cited by examiner

BONDING SYSTEM AND BONDING METHOD

CROSS-REFERENCE TO RELATED APPLICATION

This application claims the benefit of Japanese Patent Application No. 2018-072832 filed on Apr. 5, 2018, the entire disclosures of which are incorporated herein by reference.

TECHNICAL FIELD

The embodiments described herein pertain generally to a bonding system and a bonding method.

BACKGROUND

Conventionally, as a method of bonding substrates such as semiconductor wafers to each other, there is known a method of modifying bonding surfaces of substrates, hydrophilizing the modified surfaces of the substrates, and bonding the hydrophilized substrates to each other by Van der Waals force and hydrogen bonding (intermolecular force) (see Patent Document 1).

Patent Document 1: Japanese Patent Laid-open Publication No. 2017-005058

SUMMARY

In view of the foregoing, exemplary embodiments provide a technology capable of suppressing edge voids which occur on the bonded substrates.

In an exemplary embodiment, a bonding system includes a surface modifying apparatus, a surface hydrophilizing apparatus and a bonding apparatus. The surface modifying apparatus is configured to modify a bonding surface of a first substrate and a bonding surface of a second substrate with plasma. The surface hydrophilizing apparatus is configured to hydrophilize the bonding surface of the first substrate and the bonding surface of the second substrate which have been modified by the surface modifying apparatus. The bonding apparatus includes a condensation suppressing gas discharge unit configured to discharge a condensation suppressing gas for suppressing condensation toward a space between a peripheral portion of the bonding surface of the first substrate and a peripheral portion of the bonding surface of the second substrate facing each other, and is configured to bond the bonding surface of the first substrate and the bonding surface of the second substrate, which have been hydrophilized by the surface hydrophilizing apparatus, by an intermolecular force.

According to the exemplary embodiment, the edge voids which occur on the bonded substrates can be reduced.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a bonding system and a bonding method according to the present disclosure will be explained in detail with reference to the accompanying drawings. It should be noted that the exemplary embodiments are not intended to be anyway limiting. It is to be noted that the drawings are illustrative of the invention, and a relationship between the sizes of components and the proportions of the respective components can be different from the real ones. Also, the drawings may be different from each other in a relationship between the sizes of components and the proportions of the respective components.

Conventionally, as a method of bonding substrates such as semiconductor wafers to each other, there is known a method of modifying bonding surfaces of substrates, hydrophilizing the modified surfaces of the substrates, and bonding the hydrophilized substrates to each other by Van der Waals force and hydrogen bonding (intermolecular force).

Meanwhile, when the hydrophilized substrates are bonded to each other, voids (hereafter, referred to as "edge voids") may occur on a peripheral portion of the bonded substrates. If such edge voids occur, a portion including the edge voids cannot be used as a product, and, thus, there is a concern that the yield might be decreased.

Accordingly, the edge voids which occur on the bonded substrates are required to be suppressed.

Configuration of Bonding System

Figure 1:
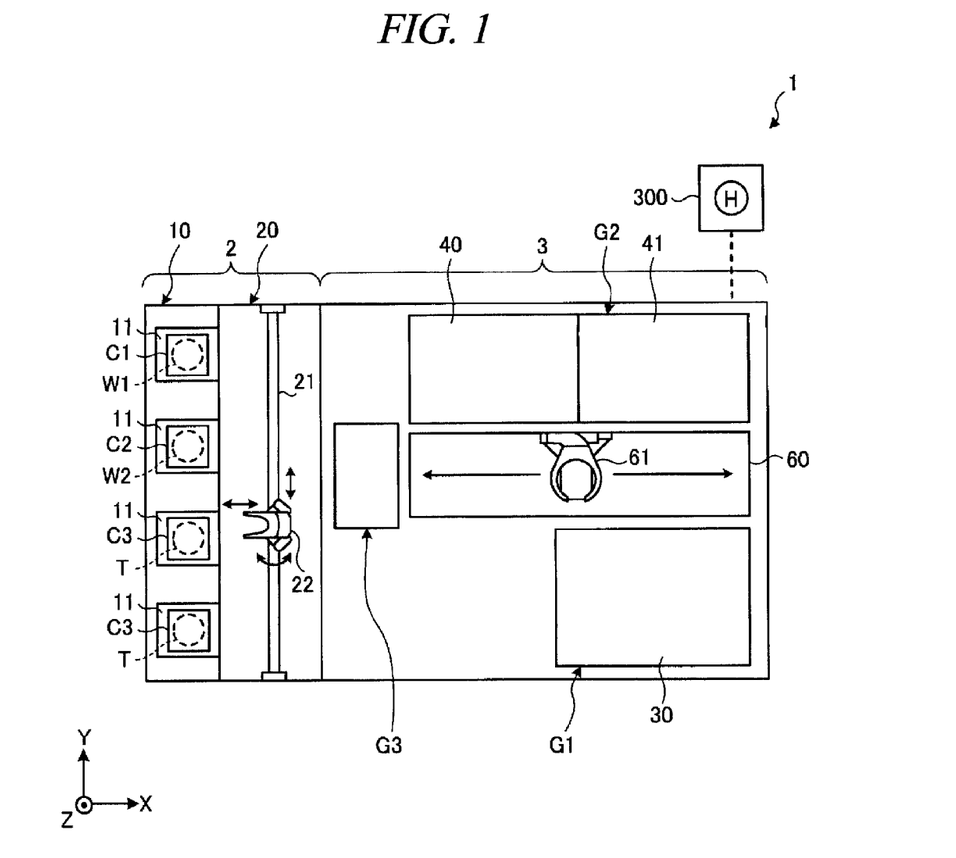
FIG. 1 is a schematic plan view illustrating a configuration of a bonding system according to an exemplary embodiment.
Figure 2:
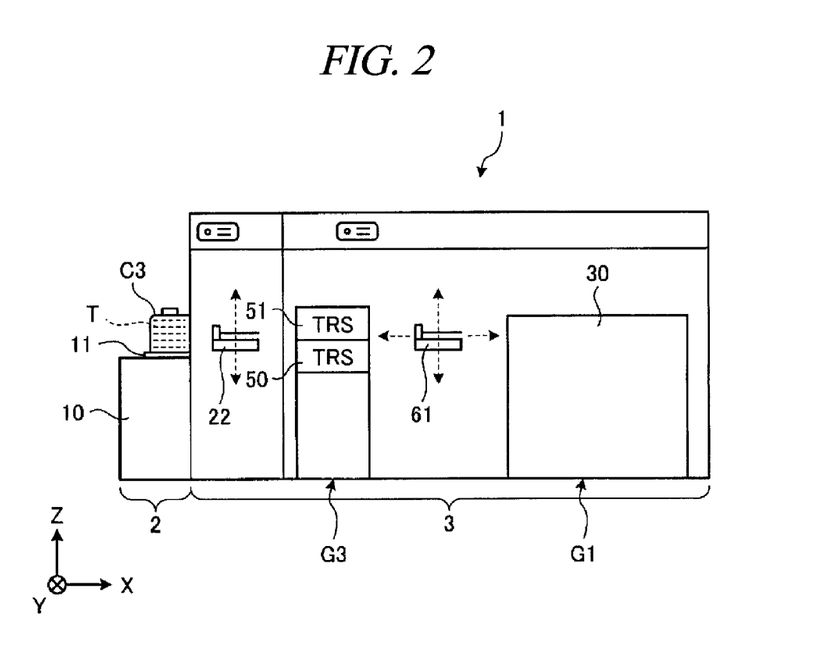
FIG. 2 is a schematic side view illustrating the configuration of the bonding system according to the exemplary embodiment.
Figure 3:
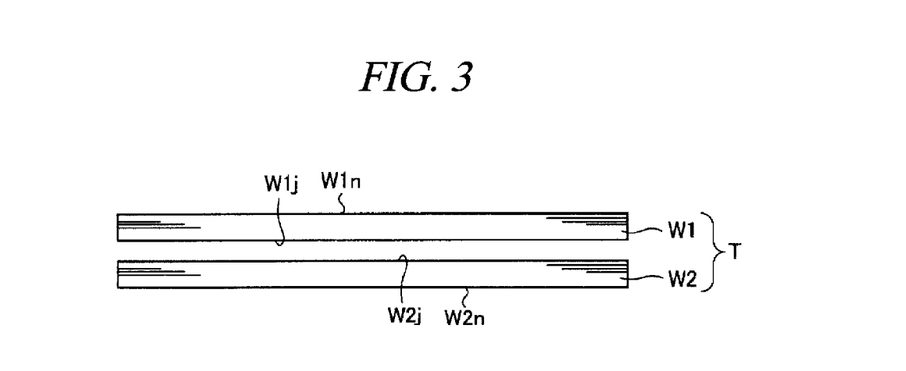
FIG. 3 is a schematic side view of an upper wafer and a lower wafer according to the exemplary embodiment.

First, a configuration of a bonding system 1 according to an exemplary embodiment will be explained with reference to FIG. 1 to FIG. 3. FIG. 1 is a schematic plan view illustrating a configuration of the bonding system 1 according to the exemplary embodiment, and FIG. 2 is a schematic side view illustrating the configuration of the bonding system 1 according to the exemplary embodiment. Further, FIG. 3 illustrates a schematic side view of an upper wafer and a lower wafer according to the exemplary embodiment. In each of the drawings referred to below, in order to explain clearly, there is provided an orthogonal coordinate system in which vertically upward direction is a positive Z-axis direction.

A bonding system 1 shown in FIG. 1 is configured to form a combined wafer T by joining a first substrate W1 and a second substrate W2 to each other.

The first substrate W1 is, for example, a semiconductor substrate such as a silicon wafer or a compound semiconductor wafer on which a multiple number of electronic circuits are formed. The second substrate W2 is, for example, a bare wafer on which no electronic circuit is formed. The first substrate W1 and the second substrate W2 have the substantially same diameter. Further, an electronic circuit may be formed on the second substrate W2.

In the description that follows, the first substrate W1 may sometimes be referred to as "upper wafer W1"; the second substrate W2, "lower wafer W2". That is, the upper wafer W1 is an example of the first substrate, and the lower wafer W2 is an example of the second substrate. Further, when the upper wafer W1 and the lower wafer W2 are referred to together, they may be referred to as "wafer W".

Further, in the following description, as depicted in FIG. 3, among surfaces of the upper wafer W1, a surface to be bonded to the lower wafer W2 will be referred to as "bonding surface W1$j$", and a surface opposite to the bonding surface W1$j$ will be referred to as "non-bonding surface W1$n$". Further, among surfaces of the lower wafer W2, a surface to be bonded to the upper wafer W1 will be referred to as "bonding surface W2$j$", and a surface opposite to the bonding surface W2$j$ will be referred to as "non-bonding surface W2$n$".

As shown in FIG. 1, the bonding system 1 includes a carry-in/out station 2 and a processing station 3. The carry-in/out station 2 and the processing station 3 are arranged in this sequence along the positive X-axis direction. Further, the carry-in/out station 2 and the processing station 3 are connected as a single body.

The carry-in/out station 2 includes a placing table 10 and a transfer section 20. The placing table 10 is equipped with a multiple number of placing plates 11. Provided on the placing plates 11 are cassettes C1, C2 and C3 each of which accommodates therein a plurality of (e.g., 25 sheets of) substrates horizontally. For example, the cassette C1 accommodates therein the upper wafers W1; the cassette C2, the lower wafers W2; and the cassettes C3, the combined wafers T.

The transfer section 20 is provided adjacent to the positive X-axis side of the placing table 10. Provided in the transfer section 20 are a transfer path 21 extended in the Y-axis direction and a transfer device 22 configured to be movable along the transfer path 21.

The transfer device 22 is configured to be movable in the X-axis direction as well as in the Y-axis direction and pivotable around the Z-axis. Further, the transfer device 22 is also configured to transfer the upper wafers W1, the lower wafers W2 and the combined wafers T between the cassettes C1 to C3 placed on the placing plates 11 and a third processing block G3 of the processing station 3 to be described later.

Further, the number of the cassettes C1 to C3 placed on the placing plates 11 is not limited to the shown example. In addition, besides the cassettes C1 to C3, a cassette or the like for collecting a problematic substrate may be additionally provided on the placing plates 11.

A multiple number of, for example, three processing blocks G1, G2 and G3 equipped with various kinds of devices are provided in the processing station 3. For example, the first processing block G1 is provided at a front side (negative Y-axis side of FIG. 1) of the processing station 3, and the second processing block G2 is provided at a rear side (positive Y-axis side of FIG. 1) of the processing station 3. Further, the third processing block G3 is provided at a side of the carry-in/out station 2 (negative X-axis side of FIG. 1) of the processing station 3.

Provided in the first processing block G1 is a surface modifying apparatus 30 configured to modify the bonding surface W1$j$ of the upper wafer W1 and the bonding surface W2$j$ of the lower wafer W2 by plasma of a processing gas. In the surface modifying apparatus 30, the $SiO_2$ bond on the bonding surfaces W1$j$ and W2$j$ of the upper wafer W1 and the lower wafer W2 is cut to be turned into SiO of a single bond, so that the bonding surfaces W1$j$ and W2$j$ are modified such that these surfaces are easily hydrophilized afterwards.

Furthermore, in the surface modifying apparatus 30, for example, a preset processing gas is excited into plasma under a decompressed atmosphere to be ionized. As these ions of elements contained in the processing gas are irradiated to the bonding surfaces W1$j$ and W2$j$ of the upper wafer W1 and the lower wafer W2, the bonding surfaces W1$j$ and W2$j$ are plasma-processed to be modified. Details of the surface modifying apparatus 30 will be described later.

In the second processing block G2, a surface hydrophilizing apparatus 40 and a bonding apparatus 41 are disposed. The surface hydrophilizing apparatus 40 is configured to hydrophilize the bonding surfaces W1$j$ and W2$j$ of the upper wafer W1 and the lower wafer W2 with, for example, pure water, and configured to clean the bonding surfaces W1$j$ and W2$j$.

In this surface hydrophilizing apparatus 40, while rotating the upper wafer W1 (the lower wafer W2) held by, for example, a spin chuck, the pure water is supplied onto the upper wafer W1 (the lower wafer W2). Accordingly, the pure water supplied onto the upper wafer W1 (the lower wafer W2) is diffused onto the bonding surface W1$j$ of the upper wafer W1 (the bonding surface W2$j$ of the lower wafer W2), so that the bonding surfaces W1$j$ and W2$j$ are hydrophilized.

The bonding apparatus 41 is configured to bond the upper wafer W1 and the lower wafer W2. A specific configuration of the bonding apparatus 41 will be discussed later.

In the third processing block G3, as shown in FIG. 2, transition (TRS) devices 50 and 51 for the upper wafer W1, the lower wafer W2 and the combined wafer T are provided in two levels in this order from below.

Further, as illustrated in FIG. 1, a transfer section 60 is formed in a region surrounded by the first processing block G1, the second processing block G2 and the third processing block G3. A transfer device 61 is provided in the transfer section 60. The transfer device 61 is equipped with, for example, a transfer arm which is configured to be movable in a vertical direction and a horizontal direction and pivotable around a vertical axis.

The transfer device 61 is moved within the transfer section 60 and transfers the upper wafers W1, the lower wafers W2 and the combined wafers T with respect to preset devices within the first processing block G1, the second processing block G2 and the third processing block G3 which are adjacent to the transfer section 60.

Furthermore, the bonding system 1 includes a control device 300. The control device 300 controls an operation of the bonding system 1. The control device 300 may be implemented by, for example, a computer and includes a non-illustrated controller and a non-illustrated storage unit. The storage unit stores therein programs for controlling various kinds of processings such as bonding processing. The controller controls an operation of the bonding system 1 by reading and executing the programs stored in the storage unit.

Further, the program may be recorded in a computer-readable recording medium and installed from the recording medium to the storage unit of the control device 300. The computer-readable recording medium may be, by way of non-limiting example, a hard disc (HD), a flexible disc (FD), a compact disc (CD), a magnet optical disc (MO), or a memory card.

<Configuration of Surface Modifying Apparatus>

Figure 4:
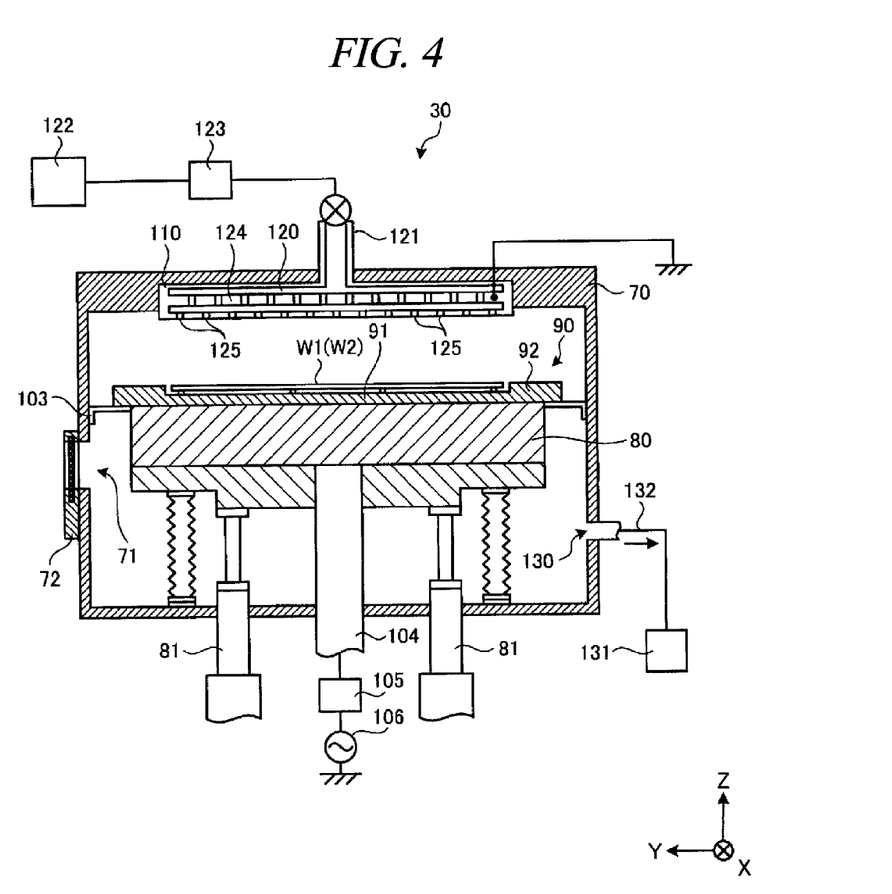
FIG. 4 is a schematic cross-sectional view illustrating a configuration of a surface modifying apparatus according to the exemplary embodiment.

Now, a configuration of the surface modifying apparatus 30 will be explained with reference to FIG. 4. FIG. 4 is a schematic cross-sectional view illustrating a configuration of the surface modifying apparatus 30.

As depicted in FIG. 4, the surface modifying apparatus 30 includes a processing vessel 70 configured to be a hermetically sealed. A carry-in/out opening 71 for the upper wafer W1 or the lower wafer W2 is formed at a side surface of the processing vessel 70 at a side of the transfer region 60 (see FIG. 1). A gate valve 72 is provided at the carry-in/out opening 71.

A stage 80 is placed within the processing vessel 70. The stage 80 may serve as, e.g., a lower electrode and may be made of a conductive material such as aluminum or the like. A plurality of driving units 81 including, for example, a motor or the like is provided under the stage 80. The plurality of driving units 81 move the stage 80 up and down.

An evacuation ring 103 including a plurality of baffle holes is placed between the stage 80 and an inner wall of the processing vessel 70. An atmosphere within the processing vessel 70 is uniformly evacuated from the processing vessel 70 by the evacuation ring 103.

A power feed rod 104 made of a conductor is connected to a lower surface of the stage 80. The power feed rod 104 is connected to a first high frequency power supply 106 via a matching unit 105 including, for example, a blocking capacitor or the like. When a plasma processing is performed, a predetermined high-frequency voltage is applied to the stage 80 from the first high-frequency power supply 106.

An upper electrode 110 is placed within the processing vessel 70. An upper surface of the stage 80 and a lower surface of the upper electrode 110 are arranged in parallel to face each other with a predetermined distance therebetween. The distance between the upper surface of the stage 80 and the lower surface of the upper electrode 110 is adjusted by the driving units 81.

The upper electrode 110 is grounded and connected to a ground potential. Since the upper electrode 110 is grounded, it is possible to suppress damage on the lower surface of the upper electrode 110 during the plasma processing.

As stated above, by applying the high-frequency voltage to the stage 80 serving as the lower electrode from the first high-frequency power supply 106, plasma is generated within the processing vessel 70.

In the exemplary embodiment, the stage 80, the power feed rod 104, the matching unit 105, the first high-frequency power supply 106, the upper electrode 110, and a matching unit are an example of a plasma generation mechanism configured to generate plasma of a processing gas within the processing vessel 70. Further, the first high-frequency power supply 106 is controlled by the above-described control device 300.

A hollow portion 120 is formed within the upper electrode 110. The hollow portion 120 is connected to a gas supply pipe 121. The gas supply pipe 121 communicates with a gas supply source 122 configured to store therein a processing gas or a charge neutralization gas. Further, the gas supply pipe 121 is provided with a supply device group 123 including a valve and a flow rate control unit configured to control the flow of the processing gas or the charge neutralization gas.

Further, a flow rate of the processing gas or the charge neutralization gas supplied from the gas supply source 122 is controlled by the supply device group 123 and the processing gas or the charge neutralization gas is introduced into the hollow portion 120 of the upper electrode 110 through the gas supply pipe 121. For example, an oxygen gas, a nitrogen gas, an argon gas, or the like may be used as the processing gas. Further, an inert gas such as a nitrogen gas or an argon gas may be used as the charge neutralization gas.

A baffle plate 124 configured to promote uniform diffusion of the processing gas or the charge neutralization gas is provided within the hollow portion 120. The baffle plate 124 includes a plurality of small holes. A plurality of gas discharge openings 125 through which the processing gas or the charge neutralization gas is discharged into the processing vessel 70 from the hollow portion 120 is formed in the lower surface of the upper electrode 110.

A suction opening 130 is formed in the processing vessel 70. The suction opening 130 is connected to a suction pipe 132 that communicates with a vacuum pump 131 configured to decompress the atmosphere within the processing vessel 70 to a predetermined vacuum level.

The upper surface of the stage 80, i.e., the facing surface to the upper electrode 110, has a circular horizontal surface having a greater diameter than the upper wafer W1 and the lower wafer W2 when viewed from the top. A stage cover 90 is placed on the upper surface of the stage 80, and the upper wafer W1 or the lower wafer W2 is placed on a placing portion 91 of the stage cover 90.

Configuration of Bonding Apparatus

Figure 5:
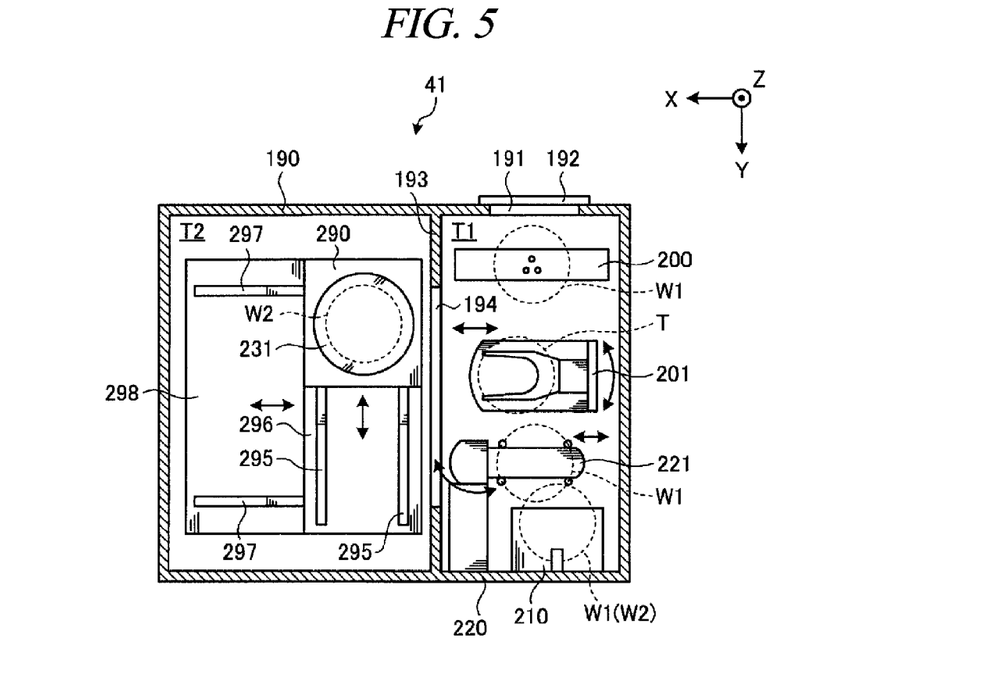
FIG. 5 is a schematic plan view illustrating a configuration of a bonding apparatus according to the exemplary embodiment.
Figure 6:
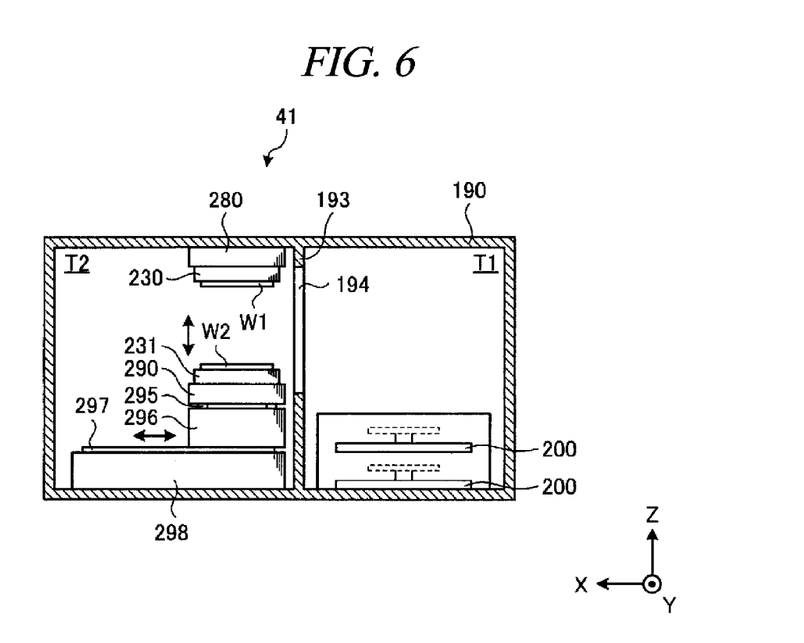
FIG. 6 is a schematic side view illustrating the configuration of the bonding apparatus according to the exemplary embodiment.

Now, a configuration of the bonding apparatus 41 will be explained with reference to FIG. 5 and FIG. 6. FIG. 5 is a schematic plan view illustrating a configuration of the bonding apparatus 41 according to the exemplary embodiment, and FIG. 6 is a schematic side view illustrating the configuration of the bonding apparatus 41 according to the exemplary embodiment.

As depicted in FIG. 5, the bonding apparatus 41 includes a processing vessel 190 configured to be a hermetically sealed. A carry-in/out opening 191 for the upper wafer W1, the lower wafer W2 and the combined wafer T is formed at a side surface of the processing vessel 190 at the side of the transfer region 60. A shutter 192 for opening/closing the carry-in/out opening 191 is provided at the carry-in/out opening 191.

An inner space of the processing vessel 190 is partitioned into a transfer region T1 and a processing region T2 by an inner wall 193. The aforementioned carry-in/out opening 191 is formed at the side surface of the processing vessel 190 in the transfer region T1. Further, the inner wall 193 is also provided with a carry-in/out opening 194 for the upper wafer W1, the lower wafer W2 and the combined wafer T.

A transition 200 configured to temporarily place thereon the upper wafer W1, the lower wafer W2 and the combined wafer T is provided at the negative Y-axis side of the transfer region T1. The transition 200 has two levels, for example, and is capable of holding any two of the upper wafer W1, the lower wafer W2 and the combined wafer T.

A transfer mechanism 201 is provided in the transfer region T1. The transfer mechanism 201 is equipped with, for example, a transfer arm which is configured to be movable in a vertical direction and a horizontal direction and pivotable around a vertical axis. The transfer mechanism 201 transfers the upper wafer W1, the lower wafer W2 and the combined wafer T within the transfer region T1 or between the transfer region T1 and the processing region T2.

A position adjusting mechanism 210 configured to adjust directions of the upper wafer W1 and the lower wafer W2 in a horizontal direction is provided at the positive Y-axis side of the transfer region T1. In the position adjusting mechanism 210, while the upper wafer W1 and the lower wafer W2 attracted to and held by a non-illustrated holding unit are rotated, a non-illustrated detector detects positions of notches of the upper wafer W1 and the lower wafer W2.

Thus, the position adjusting mechanism 210 adjusts the positions of the notches to adjust the directions of the upper wafer W1 and the lower wafer W2 in the horizontal direction. Further, an inverting mechanism 220 configured to invert a front surface and a rear surface of the upper wafer W1 is provided in the transfer region T1.

As depicted in FIG. 6, an upper chuck 230 and a lower chuck 231 are provided in the processing region T2. The upper chuck 230 is configured to attract and hold the upper wafer W1 from above. Further, the lower chuck 231 is located below the upper chuck 230 and configured to attract and hold the lower wafer W2 from below.

The upper chuck 230 is supported by a supporting member 280 provided on a ceiling of the processing vessel 190 as depicted in FIG. 6. The supporting member 280 is equipped with a non-illustrated upper imaging unit configured to image the bonding surface W2$j$ of the lower wafer W2 held by the lower chuck 231. The upper imaging unit is provided adjacent to the upper chuck 230.

As depicted in FIG. 5 and FIG. 6, the lower chuck 231 is supported by a first lower chuck moving unit 290 which is provided under the corresponding lower chuck 231. The first lower chuck moving unit 290 is configured to move the lower chuck 231 in the horizontal direction (Y-axis direction), as will be described later. Further, the first lower chuck moving unit 290 is also configured to move the lower chuck 231 in the vertical direction and rotate the lower chuck 231 around a vertical axis.

As depicted in FIG. 5, the first lower chuck moving unit 290 is equipped with a non-illustrated lower imaging unit configured to image the bonding surface W1$j$ of the upper wafer W1 held by the upper chuck 230. The lower imaging unit is provided adjacent to the lower chuck 231.

As depicted in FIG. 5 and FIG. 6, the first lower chuck moving unit 290 is mounted to a pair of rails 295 which is provided at a bottom surface side of the first lower chuck moving unit 290 and extended in the horizontal direction (Y-axis direction). The first lower chuck moving unit 290 is configured to be moved along the rails 295.

The rails 295 are provided on a second lower chuck moving unit 296. The second lower chuck moving unit 296 is mounted on a pair of rails 297 which is provided at a bottom surface side of the second lower chuck moving unit 296 and extended in the horizontal direction (X-axis direction).

This second lower chuck moving unit 296 is configured to be moved along the rails 297, i.e., configured to move the lower chuck 231 in the horizontal direction (X-axis direction). Further, the rails 297 are provided on a placing table 298 provided on the bottom surface of the processing vessel 190.

Figure 7:
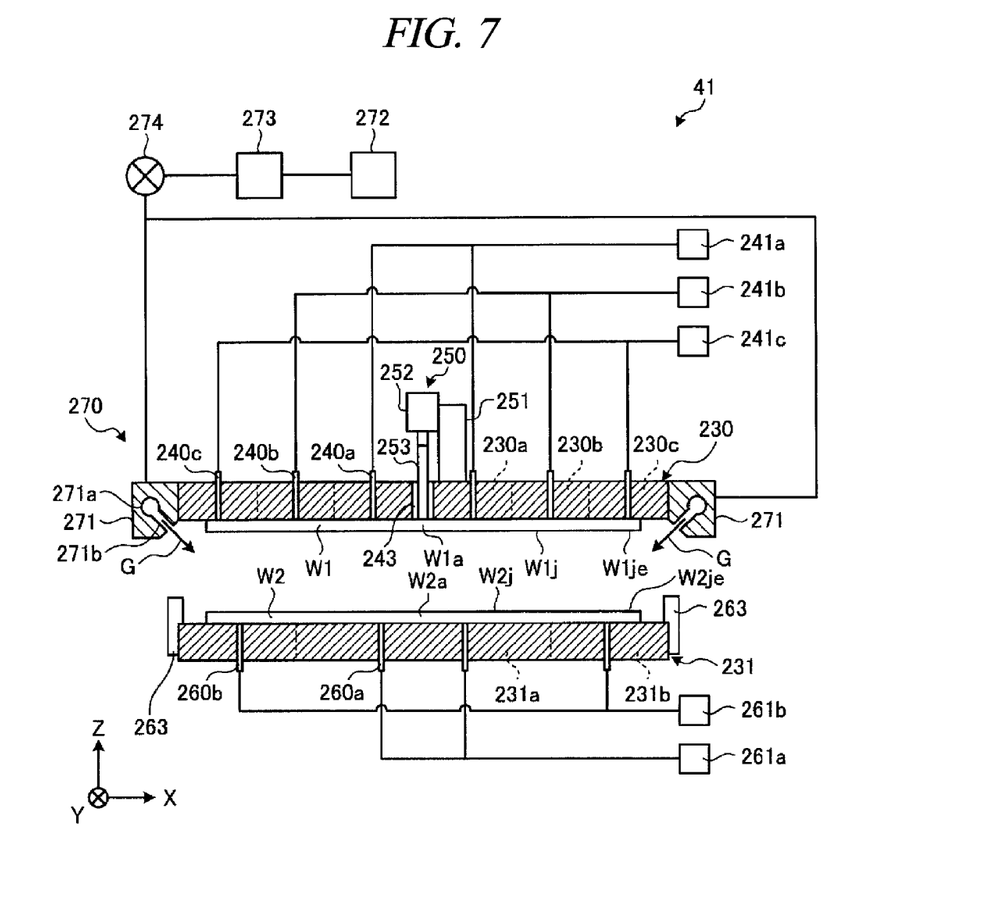
FIG. 7 is a schematic side view illustrating configurations of an upper chuck and a lower chuck of the bonding apparatus according to the exemplary embodiment.

Now, the configuration of the upper chuck 230 and the lower chuck 231 of the bonding apparatus 41 will be explained with reference to FIG. 7. FIG. 7 is a schematic side view illustrating the configuration of the upper chuck 230 and the lower chuck 231 of the bonding apparatus 41 according to the exemplary embodiment.

As depicted in FIG. 7, the upper chuck 230 has a substantially circular plate shape and is partitioned into a multiple number of, e.g., three sections 230$a$, 230$b$, and 230$c$. These sections 230$a$, 230$b$, and 230$c$ are provided in sequence from a central portion of the upper chuck 230 to a peripheral portion (outer peripheral portion) thereof. The section 230$a$ has a circular shape when viewed from the top, and the sections 230$b$ and 230$c$ have an annular shape when viewed from the top.

As depicted in FIG. 7, the sections 230$a$, 230$b$, and 230$c$ are respectively equipped with suction lines 240$a$, 240$b$, and 240$c$ configured to attract and hold the upper wafer W1. The suction lines 240$a$, 240$b$, and 240$c$ are connected to different vacuum pumps 241$a$, 241$b$, and 241$c$, respectively. As stated above, the upper chuck 230 is configured to set the vacuum evacuation of the upper wafer W1 on each of the sections 230$a$, 230$b$, and 230$c$.

A through hole 243 is formed through the upper chuck 230 in a thickness direction thereof in the central portion of the upper chuck 230. The central portion of the upper chuck 230 corresponds to a central portion W1$a$ of the upper wafer W1 attracted to and held by the upper chuck 230. A pressing pin 253 of a substrate pressing mechanism 250 is inserted through the through hole 243.

The substrate pressing mechanism 250 is provided on an upper surface of the upper chuck 230 and configured to press the central portion W1$a$ of the upper wafer W1 with the pressing pin 253. The pressing pin 253 is provided to be linearly moved along the vertical axis by a cylinder unit 251 and an actuator unit 252 and a leading end of the pressing pin 253 presses the substrate (upper wafer W1 in the exemplary embodiment) facing the leading end of the pressing pin 253.

To be specific, when the upper wafer W1 and the lower wafer W2 are bonded to each other as will be described later, the pressing pin 253 serves as a starter to bring the central portion W1a of the upper wafer W1 into contact with the central portion W2a of the lower wafer W2.

The lower chuck 231 has a substantially circular plate shape and is partitioned into a multiple number of, e.g., two sections 231a and 231b. These sections 231a and 231b are provided in sequence from a central portion of the lower chuck 231 to a peripheral portion thereof. The section 231a has a circular shape when viewed from the top, and the sections 231b has an annular shape when viewed from the top.

As depicted in FIG. 7, the sections 231a and 231b are respectively equipped with suction lines 260a and 260b configured to attract and hold the lower wafer W2. The suction lines 260a and 260b are connected to different vacuum pumps 261a and 261b, respectively. As stated above, the lower chuck 231 is configured to set the vacuum evacuation of the lower wafer W2 on each of the sections 231a and 231b.

On the peripheral portion of the lower chuck 231, stopper members 263 configured to suppress the upper wafer W1, the lower wafer W2 and the combined wafer T from being protruded or slid from the corresponding lower chuck 231 are provided in a plurality of, e.g., five positions.

Further, the bonding apparatus 41 includes a condensation suppressing gas discharge unit 270 configured to discharge a condensation suppressing gas G for suppressing condensation toward a peripheral portion W1je of the bonding surface W1j of the upper wafer W1 and a peripheral portion W2je of the bonding surface W2j of the lower wafer W2 facing each other.

In the exemplary embodiment, the condensation suppressing gas G includes, for example, a He gas or an inert gas such as an Ar gas, a Ne gas, a nitrogen gas each having a high Joule-Thomson effect and an effect of suppressing the condensation. Further, the condensation suppressing gas G may include, for example, dry air having a low moisture content and the effect of suppressing the condensation.

The condensation suppressing gas discharge unit 270 is equipped with a main body 271, a condensation suppressing gas supply source 272, a flow rate controller 273, and a valve 274. The main body 271 has, for example, a circular ring shape and is placed to surround the peripheral portion of the upper chuck 230.

The main body 271 is equipped with, for example, an annular pipe 271a. Further, multiple discharge openings 271b arranged at a regular interval along a circumferential direction of the pipe 271a are formed from the pipe 271a toward a space between the peripheral portion W1je of the bonding surface W1j of the upper wafer W1 and the peripheral portion W2je of the bonding surface W2j of the lower wafer W2 facing each other.

The pipe 271a of the main body 271 communicates with the condensation suppressing gas supply source 272 via the flow rate controller 273 and the valve 274.

A flow rate of the condensation suppressing gas G supplied from the condensation suppressing gas supply source 272 is controlled by the flow rate controller 273 and the valve 274, and the condensation suppressing gas G is introduced into the pipe 271a. Further, the condensation suppressing gas G is discharged from the discharge openings 271b toward the space between the peripheral portion W1je of the bonding surface W1j of the upper wafer W1 and the peripheral portion W2je of the bonding surface W2j of the lower wafer W2 facing each other.

The multiple discharge openings 271b (e.g., twelve discharge openings 271b at the regular interval of 30°) are uniformly formed along the circumferential direction in the main body 271. Thus, the condensation suppressing gas discharge unit 270 can substantially uniformly discharge the condensation suppressing gas G along the circumferential direction toward the space between the peripheral portion W1je of the bonding surface W1j of the upper wafer W1 and the peripheral portion W2je of the bonding surface W2j of the lower wafer W2 facing each other.

In the exemplary embodiment, there has been explained an example where the multiple discharge openings 271b are uniformly formed along the circumferential direction in the main body 271. However, the number of discharge openings formed in the main body 271 may not be plural. For example, one discharge opening having a slit shape may be formed along the circumferential direction in the main body 271.

Even in this configuration, the condensation suppressing gas discharge unit 270 can substantially uniformly discharge the condensation suppressing gas G along the circumferential direction toward the space between the peripheral portion W1je of the bonding surface W1j of the upper wafer W1 and the peripheral portion W2je of the bonding surface W2j of the lower wafer W2 facing each other.

In the exemplary embodiment, there has been explained an example where the condensation suppressing gas discharge unit 270 is placed on the peripheral portion of the upper chuck 230. However, the arrangement of the condensation suppressing gas discharge unit 270 is not limited thereto. For example, the condensation suppressing gas discharge unit 270 may be placed on the peripheral portion of the lower chuck 231.

As stated above, the bonding apparatus 41 according to the exemplary embodiment is configured to discharge, through the condensation suppressing gas discharge unit 270, the condensation suppressing gas G toward the space between the peripheral portion W1je of the bonding surface W1j of the upper wafer W1 and the peripheral portion W2je of the bonding surface W2j of the lower wafer W2 facing each other.

Processings Performed by Bonding System

Figure 8:
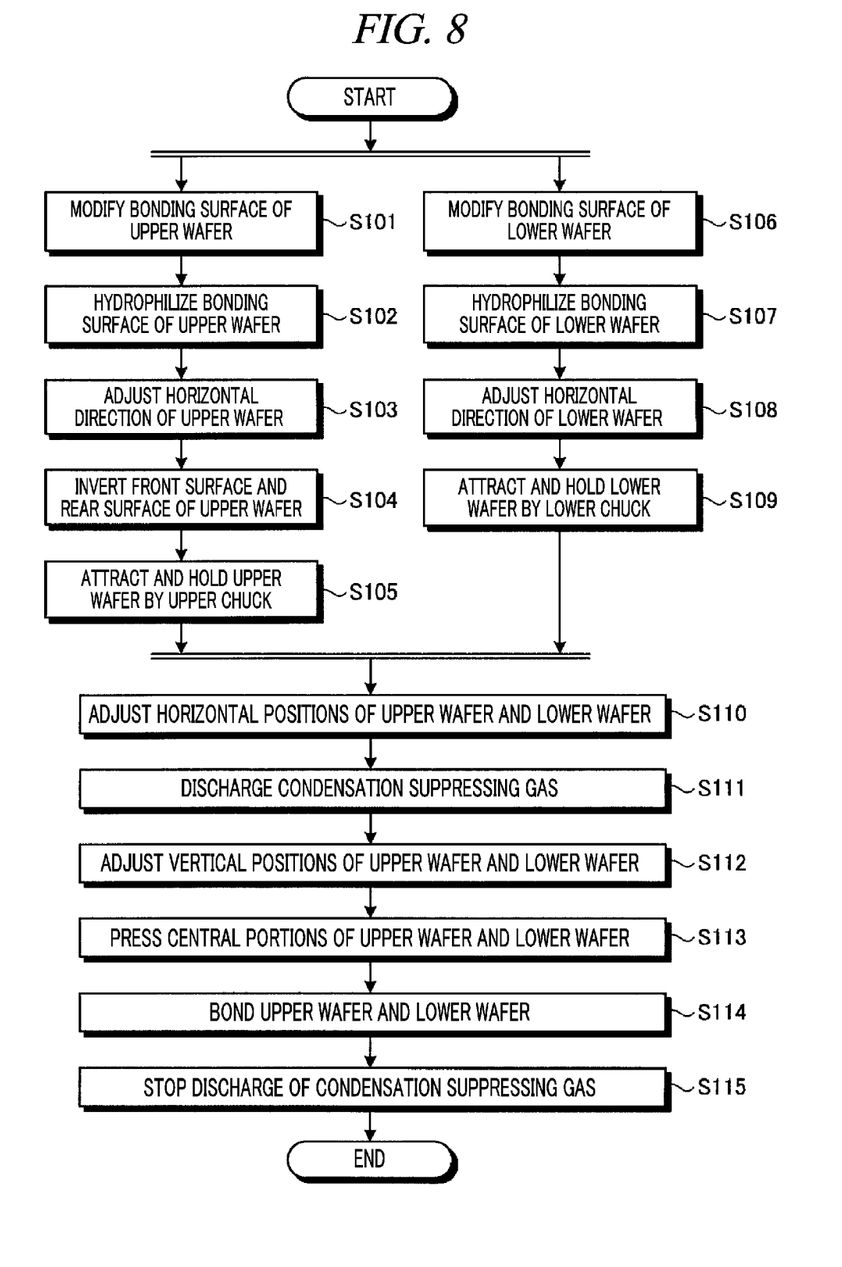
FIG. 8 is a flowchart illustrating a part of a sequence of processings performed by the bonding system according to the exemplary embodiment.

Now, a processing performed by the bonding system 1 according to the exemplary embodiment will be explained in detail with reference to FIG. 8. FIG. 8 is a flowchart illustrating a part of a sequence of processings performed by the bonding system 1 according to the exemplary embodiment. Further, various processings shown in FIG. 8 are performed under the control of the control device 300.

First, the cassette C1 accommodating the upper wafers W1, the cassette C2 accommodating the lower wafers W2 and the empty cassette C3 are placed on the preset placing plates 11 of the carry-in/out station 2. Then, the upper wafer W1 is taken out of the cassette C1 by the transfer device 22 and is transferred to the transition device 50 of the third processing block G3 of the processing station 3.

Subsequently, the upper wafer W1 is transferred into the surface modifying apparatus 30 of the first processing block G1 by the transfer device 61. At this time, the gate valve 72 is opened and the inside of the processing vessel 70 is opened to an atmospheric pressure. In the surface modifying apparatus 30, the processing gas is excited into plasma to be ionized under a preset decompressed atmosphere.

The generated ions are irradiated to the bonding surface W1j of the upper wafer W1, so that the bonding surface W1j is plasma-processed. As a result, a dangling bond of silicon atoms is formed on the uppermost surface of the bonding surface W1j, so that the bonding surface W1j of the upper wafer W1 is modified (process S101).

Then, the upper wafer W1 is transferred into the surface hydrophilizing apparatus 40 of the second processing block G2 by the transfer device 61. In the surface hydrophilizing apparatus 40, the pure water is supplied onto the upper wafer W1 while rotating the upper wafer W1 held by the spin chuck.

The supplied pure water is diffused on the bonding surface W1j of the upper wafer W1. Thus, in the surface hydrophilizing apparatus 40, OH groups (silanol groups) adhere to the dangling bond of silicon atoms on the modified bonding surface W1j of the upper wafer W1, so that the bonding surface W1j is hydrophilized (process S102). Further, the bonding surface W1j of the upper wafer W1 is cleaned by the corresponding pure water.

Then, the upper wafer W1 is transferred into the bonding apparatus 41 of the second processing block G2 by the transfer device 61. The upper wafer W1 carried into the bonding apparatus 41 is then transferred into the position adjusting mechanism 210 via the transition 200. Then, the direction of the upper wafer W1 in the horizontal direction is adjusted by the position adjusting mechanism 210 (process S103).

Afterwards, the upper wafer W1 is delivered onto the inverting mechanism 220 from the position adjusting mechanism 210. Then, in the transfer region T1, by operating the inverting mechanism 220, the front surface and the rear surface of the upper wafer W1 are inverted (process S104). That is, the bonding surface W1j of the upper wafer W1 is turned to face downward.

Thereafter, the inverting mechanism 220 is moved to be located under the upper chuck 230 by being rotated. The upper wafer W1 is then transferred to the upper chuck 230 from the inverting mechanism 220. The non-bonding surface W1n of the upper wafer W1 is attracted to and held by the upper chuck 230 (process S105).

While the above-described processes S101 to S105 are being performed on the upper wafer W1, processings of the lower wafer W2 are performed. First, the lower wafer W2 is taken out of the cassette C2 by the transfer device 22 to be transferred into the transition device 50 of the processing station 3.

Thereafter, the lower wafer W2 is transferred into the surface modifying apparatus 30 by the transfer device 61, and the bonding surface W2j of the lower wafer W2 is modified (process S106). Further, the process S106 is the same as the above-stated process S101.

Subsequently, the lower wafer W2 is transferred into the surface hydrophilizing apparatus 40 by the transfer device 61, so that the bonding surface W2j of the lower wafer W2 is hydrophilized (process S107). Further, the process S107 is the same as those in the above-described process S102.

Then, the lower wafer W2 is transferred into the bonding apparatus 41 by the transfer device 61. The lower wafer W2 carried into the bonding apparatus 41 is then transferred into the position adjusting mechanism 210 via the transition 200. Then, the direction of the lower wafer W2 in the horizontal direction is adjusted by the position adjusting mechanism 210 (process S108).

Afterwards, the lower wafer W2 is transferred onto the lower chuck 231 to be attracted to and held by the lower chuck 231 (process S109). Here, the non-bonding surface W2n of the lower wafer W2 is attracted to and held by the lower chuck 231 in the state that the notch of the lower wafer W2 is oriented to a predetermined direction.

Then, position adjustments of the upper wafer W1 held by the upper chuck 230 and the lower wafer W2 held by the lower chuck 231 in the horizontal direction are performed (process S110).

Thereafter, the condensation suppressing gas discharge unit 270 discharges the condensation suppressing gas G toward the space between the peripheral portion W1je of the bonding surface W1j of the upper wafer W1 and the peripheral portion W2je of the bonding surface W2j of the lower wafer W2 facing each other (process S111).

Thus, the condensation suppressing gas G is supplied into the space between the peripheral portion W1je of the bonding surface W1j of the upper wafer W1 and the peripheral portion W2je of the bonding surface W2j of the lower wafer W2 facing each other. Further, the supply of the condensation suppressing gas G continues in subsequent processes.

Then, the lower chuck 231 is moved vertically upwards by the first lower chuck moving unit 290 to adjust vertical positions of the upper chuck 230 and the lower chuck 231. Thus, the vertical positions of the upper wafer W1 held by the upper chuck 230 and the lower wafer W2 held by the lower chuck 231 are adjusted (process S112).

At this time, a distance between the bonding surface W2j of the lower wafer W2 and the bonding surface W1j of the upper wafer W1 is set to a preset value, e.g., 80 µm to 200 µm.

Then, by lowering the pressing pin 253 of the substrate pressing mechanism 250, the central portion W1a of the upper wafer W1 is pushed down, and the central portion W1a of the upper wafer W1 and the central portion W2a of the lower wafer W2 are pressed with a predetermined force (process S113).

Accordingly, the bonding is started between the central portion W1a of the upper wafer W1 and the central portion W2a of the lower wafer W2 which are pressed against each other. To be specific, since the bonding surface W1j of the upper wafer W1 and the bonding surface W2j of the lower wafer W2 have been modified in the processes S101 and S106, respectively, Van der Waals force (intermolecular force) is generated between the bonding surfaces W1j and W2j, so that the bonding surfaces W1j and W2j are bonded to each other.

Further, since the bonding surface W1j of the upper wafer W1 and the bonding surface W2j of the lower wafer W2 have been hydrophilized in the processes S102 and S107, respectively, OH groups between the bonding surfaces W1j and W2j are hydrogen-bonded, so that the bonding surfaces W1j and W2j are firmly bonded to each other.

Thereafter, the bonding region between the upper wafer W1 and the lower wafer W2 is expanded from the central portion W1a of the upper wafer W1 and the central portion W2a of the lower wafer W2 toward the peripheral portions thereof. Then, in the state that the central portion W1a of the upper wafer W1 and the central portion W2a of the lower wafer W2 are pressed by the pressing pin 253, the operation of the vacuum pump 241b is stopped to stop the vacuum evacuation of the upper wafer W1 from the suction line 240b in the section 230b.

Then, the upper wafer W1 held in the section 230b falls on the lower wafer W2. Thereafter, the operation of the vacuum pump 241c is stopped to stop the vacuum evacuation of the upper wafer W1 from the suction line 240c in the section 230c.

As stated above, the vacuum evacuation of the upper wafer W1 is gradually stopped from the central portion W1a to the peripheral portion of the upper wafer W1, and the upper wafer W1 gradually falls on the lower wafer W2 to be brought into contact with each other. Further, the above-described bonding between the bonding surfaces W1j and W2j by the Van der Waals force and the hydrogen bonding is gradually expanded from the central portions W1a and W2a to the outer peripheral portions thereof.

Thus, the bonding surface W1j of the upper wafer W1 is entirely in contact with the bonding surface W2j of the lower wafer W2, and the upper wafer W1 and the lower wafer W2 are bonded to each other (process S114).

Then, the pressing pin 253 is moved up to the upper chuck 230. Further, the vacuum evacuation of the lower wafer W2 from the suction lines 260a and 260b in the lower chuck 231 is stopped to release the attracting and holding of the lower wafer W2 by the lower chuck 231.

Finally, the condensation suppressing gas discharge unit 270 stops the discharge of the condensation suppressing gas G (process S115), and the bonding processing in the bonding apparatus 41 is completed.

As stated above, in the exemplary embodiment, before the upper wafer W1 and the lower wafer W2 are bonded to each other, the condensation suppressing gas G is discharged toward the space between the peripheral portion W1je of the bonding surface W1j of the upper wafer W1 and the peripheral portion W2je of the bonding surface W2j of the lower wafer W2 facing each other. Thus, the edge voids which occur on the combined wafer T can be reduced.

Now, a difference between the case where the condensation suppressing gas G is discharged and the case where the condensation suppressing gas G is not discharged before the upper wafer W1 and the lower wafer W2 are bonded to each other will be described. To be specific, the case where the He gas as the condensation suppressing gas G is discharged (hereafter, referred to as "experimental example 1") and the case where a nitrogen gas as the condensation suppressing gas G is discharged (hereafter, referred to as "experimental example 2") are compared with the case where the condensation suppressing gas G is not discharged (hereafter, referred to as "comparative example").

With the combined wafers T bonded under the conditions of the experimental examples 1 and 2 and the comparative example, the area of the edge voids formed on the peripheral portions thereof is evaluated. Further, the evaluation on the area of the edge voids is conducted by analyzing images taken with a C-SAM (Constant-depth mode Scanning Acoustic Microscope: ultrasonic microscope).

Figure 9:
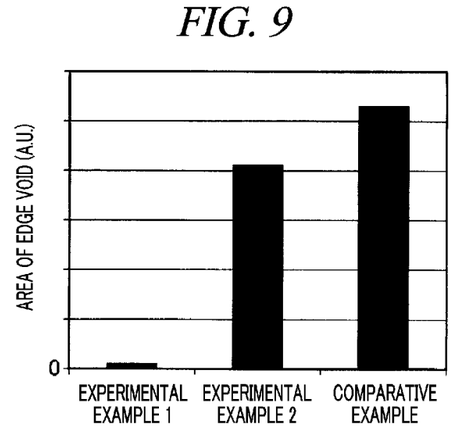
FIG. 9 is a diagram illustrating a measurement result of an area of edge voids from combined wafers of an experimental example 1, an experimental example 2, and a comparative example, respectively.

FIG. 9 is a diagram illustrating a result of the measurement on the area of the edge voids from the combined wafers T of the experimental example 1, the experimental example 2, and the comparative example, respectively. From the comparison between the area of the edge voids of the comparative example and the areas of the edge voids of the experimental example 1 and the experimental example 2, respectively, it can be seen that the occurrence of the edge voids is reduced in the experimental example 1 and the experimental example 2.

Further, in the exemplary embodiment, from the comparison between the experimental example 1 where the He gas is discharged and the experimental example 2 where the nitrogen gas is discharged, it can be seen that the occurrence of the edge voids is further reduced by discharging the He gas with a very high Joule-Thomson effect.

Now, the cause of the reduction of the edge voids according to the exemplary embodiment will be described. When the upper wafer W1 and the lower wafer W2 are bonded to each other, the central portion W1a and the central portion W2a are bonded by the intermolecular force, so that the bonding region is formed. Then, when the bonding region is expanded toward the outer peripheral portion of the wafer W, a wave (so-called bonding wave) occurs.

Herein, the occurrence of radical change in pressure on the peripheral portion of the wafer W when the bonding wave reaches the peripheral portion of the wafer W is considered as one of the causes of the occurrence of the edge voids. This is because the radical change in pressure results in the condensation on the peripheral portion W1je of the bonding surface W1j of the upper wafer W1 and the peripheral portion W2je of the bonding surface W2j of the lower wafer W2 and the edge voids are formed due to the occurrence of the condensation.

Therefore, in the exemplary embodiment, before the upper wafer W1 and the lower wafer W2 are bonded to each other, the condensation suppressing gas G is discharged to a region where the condensation resulting in the edge voids occurs. Thus, it is possible to suppress the occurrence of the condensation on the peripheral portion W1je of the bonding surface W1j of the upper wafer W1 and the peripheral portion W2je of the bonding surface W2j of the lower wafer W2.

Therefore, according to the exemplary embodiment, by discharging the condensation suppressing gas G before bonding the upper wafer W1 and the lower wafer W2 to the each other, edge voids which occur on the combined wafer T can be reduced.

Further, in the exemplary embodiment, the condensation suppressing gas discharge unit 270 can discharge the condensation suppressing gas G only to a region where the condensation resulting in the edge voids needs to be suppressed. Therefore, according to the exemplary embodiment, the consumption amount of the condensation suppressing gas G can be reduced as compared with the case where the inside of the processing vessel 190 is filled with the condensation suppressing gas G.

Furthermore, in the exemplary embodiment, after the bonding the upper wafer W1 and the lower wafer W2 to each other, the discharge of the condensation suppressing gas G is stopped as described in the process S115. Thus, the condensation suppressing gas G can be discharged only when the condensation resulting in the edge voids needs to be suppressed. Therefore, according to the exemplary embodiment, the consumption amount of the condensation suppressing gas G can be reduced.

Moreover, in the exemplary embodiment, the condensation suppressing gas G just needs to include an inert gas which has a high Joule-Thomson effect and can suppress the condensation or dry air which has a low moisture content and can suppress the condensation.

Further, in the exemplary embodiment, the condensation suppressing gas G just needs to include a He gas which has a very high Joule-Thomson effect and can greatly suppress the condensation. Thus, the edge voids which occur on the combined wafer T can be reduced effectively.

The bonding system 1 according to the exemplary embodiment includes the surface modifying apparatus 30, the surface hydrophilizing apparatus 40, and the bonding apparatus 41. The surface modifying apparatus 30 modifies the bonding surface W1j of the first substrate (upper wafer W1) and the bonding surface W2j of the second substrate (lower wafer W2) with the plasma. The surface hydrophilizing apparatus 40 hydrophilizes the bonding surface W1j of the first substrate (upper wafer W1) and the bonding surface W2j of the second substrate (lower wafer W2) which have been modified by the surface modifying apparatus 30. The bonding apparatus 41 includes the condensation suppressing gas discharge unit 270 and bonds the bonding surface W1j of the first substrate (upper wafer W1) with the bonding surface W2j of the second substrate (lower wafer W2), which have been hydrophilized by the surface hydrophilizing apparatus 40, by the intermolecular force. Further, the condensation suppressing gas discharge unit 270 discharges the condensation suppressing gas G for suppressing the condensation toward the space between the peripheral portion W1je of the bonding surface W1j of the first substrate (upper wafer W1) and the peripheral portion W2je of the bonding surface W2j of the second substrate (lower wafer W2) facing each other. Thus, the edge voids which occur on the combined wafer T can be reduced.

Further, in the bonding system 1 according to the exemplary embodiment, the condensation suppressing gas G includes an inert gas. Thus, the edge voids which occur on the combined wafer T can be reduced.

Furthermore, in the bonding system 1 according to the exemplary embodiment, the condensation suppressing gas G includes a He gas. Thus, the edge voids which occur on the combined wafer T can be reduced effectively.

Moreover, in the bonding system 1 according to the exemplary embodiment, the condensation suppressing gas G includes dry air. Thus, the edge voids which occur on the combined wafer T can be reduced.

Besides, in the bonding system 1 according to the exemplary embodiment, the condensation suppressing gas discharge unit 270 has the circular ring shape and is equipped with the main body 271 provided with the discharge openings 271b through which the condensation suppressing gas G is discharged. Thus, when the upper wafer W1 or the lower wafer W2 is carried in and out of the bonding apparatus 41, interference of the condensation suppressing gas discharge unit 270 in the transfer of the upper wafer W1 or the lower wafer W2 can be suppressed.

Further, in the bonding system 1 according to the exemplary embodiment, the discharge openings 271b are uniformly formed along the circumferential direction in the main body 271 of the condensation suppressing gas discharge unit 270. Thus, the condensation suppressing gas discharge unit 270 can substantially uniformly discharge the condensation suppressing gas G along the circumferential direction toward the space between the peripheral portion W1je of the bonding surface W1j of the upper wafer W1 and the peripheral portion W2je of the bonding surface W2j of the lower wafer W2 facing each other.

The bonding method according to the exemplary embodiment includes the surface modifying processing (processes S101 and S106), the surface hydrophilizing processing (processes S102 and S107), the gas discharging processing (process S111), and the bonding processing (process S114). In the surface modifying processing, the bonding surface W1j of the first substrate (upper wafer W1) and the bonding surface W2j of the second substrate (lower wafer W2) are modified. In the surface hydrophilizing processing, the modified bonding surface W1j of the first substrate (upper wafer W1) and the modified bonding surface W2j of the second substrate (lower wafer W2) are hydrophilized. In the gas discharging processing, the condensation suppressing gas G for suppressing the condensation is discharged toward the space between the peripheral portion W1je of the bonding surface W1j of the first substrate (upper wafer W1) and the peripheral portion W2je of the bonding surface W2j of the second substrate (lower wafer W2) facing each other. In the bonding processing, the hydrophilized bonding surface W1j of the first substrate (upper wafer W1) and the hydrophilized bonding surface W2j of the second substrate (lower wafer W2) are bonded to each other by the intermolecular force. Thus, the edge voids which occur on the combined wafer T can be reduced.

Although the exemplary embodiment has been explained above, the present disclosure is not limited thereto and various changes and modifications can be made in the present disclosure without departing from the spirit or scope of the present disclosure. For example, in the above-described exemplary embodiment, there has been explained the example where the inert gas is used as the condensation suppressing gas G having the high Joule-Thomson effect. However, any gas other than the inert gas may be used as long as it has a high Joule-Thomson effect.

Further, in the above-described exemplary embodiment, there has been explained the example where the condensation suppressing gas discharge unit 270 includes the annular pipe 271a and the discharge openings 271b. However, the configuration of the condensation suppressing gas discharge unit 270 is not limited thereto. For example, the condensation suppressing gas discharge unit 270 may include multiple nozzles, which are capable of discharging the condensation suppressing gas G, along the circumferential direction.

It should be understood that these embodiments have been presented by way of example only, and are not intended to limit the scope of the present disclosure. Indeed, the embodiments described herein may be embodied in a variety of other forms. Furthermore, various omissions, substitutions and changes in the form of the embodiments described herein may be made without departing from the accompanying claims and the spirit of the present disclosure.

We claim:

1. A bonding system, comprising:
a surface modifying apparatus configured to modify a bonding surface of a first substrate and a bonding surface of a second substrate with plasma;
a surface hydrophilizing apparatus configured to hydrophilize the bonding surface of the first substrate and the bonding surface of the second substrate which have been modified by the surface modifying apparatus; and
a bonding apparatus, including a condensation suppressing gas discharge unit configured to discharge a condensation suppressing gas configured to suppress condensation toward a space between a peripheral portion of the bonding surface of the first substrate and a peripheral portion of the bonding surface of the second substrate facing each other, configured to bond the bonding surface of the first substrate and the bonding surface of the second substrate, which have been hydrophilized by the surface hydrophilizing apparatus, by an intermolecular force,
wherein the condensation suppressing gas discharge unit is equipped with at least one discharge opening through which the condensation suppressing gas is discharged, and
the at least one discharge opening is formed outside of the first and second substrates when viewed from above, along a circumferential direction of the condensation suppressing gas discharge unit.

2. The bonding system of claim 1,
wherein the condensation suppressing gas includes an inert gas.

3. The bonding system of claim 2,
wherein the condensation suppressing gas includes a He gas.

4. The bonding system of claim 1,
wherein the condensation suppressing gas includes dry air.

5. The bonding system of claim 1,
wherein the condensation suppressing gas discharge unit is further equipped with a main body that has a circular ring shape.

6. The bonding system of claim 5,
wherein the at least one discharge opening is uniformly formed along a circumferential direction in the main body of the condensation suppressing gas discharge unit.

7. A bonding method, comprising:
modifying a bonding surface of a first substrate and a bonding surface of a second substrate;
hydrophilizing the modified bonding surface of the first substrate and the modified bonding surface of the second substrate;
discharging a condensation suppressing gas configured to suppress condensation toward a space between a peripheral portion of the bonding surface of the first substrate and a peripheral portion of the bonding surface of the second substrate facing each other; and
bonding the hydrophilized bonding surface of the first substrate and the hydrophilized bonding surface of the second substrate by an intermolecular force,
wherein the discharging of the condensation suppressing gas is performed by a condensation suppressing gas discharge unit,
the condensation suppressing gas discharge unit is equipped with at least one discharge opening through which the condensation suppressing gas is discharged, and
the at least one discharge opening is formed outside of the first and second substrates when viewed from above, along a circumferential direction of the condensation suppressing gas discharge unit.

* * * * *